US007234081B2

(12) United States Patent
Nguyen et al.

(10) Patent No.: US 7,234,081 B2
(45) Date of Patent: Jun. 19, 2007

(54) MEMORY MODULE WITH TESTING LOGIC

(75) Inventors: Vincent Nguyen, Houston, TX (US); Vi Lu, Houston, TX (US); Jeoff Krontz, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 476 days.

(21) Appl. No.: 10/771,998

(22) Filed: Feb. 4, 2004

(65) Prior Publication Data

US 2005/0188281 A1 Aug. 25, 2005

(51) Int. Cl.
*G06F 11/00* (2006.01)
(52) U.S. Cl. .......................................... 714/42; 714/733
(58) Field of Classification Search .................. 714/42, 714/54, 718, 733; 711/115
See application file for complete search history.

(56) References Cited

U.S. PATENT DOCUMENTS

| | | | | |
|---|---|---|---|---|
| 4,999,837 A | * | 3/1991 | Reynolds et al. ........... 714/703 |
| 5,008,885 A | * | 4/1991 | Huang et al. ............... 714/703 |
| 5,058,112 A | * | 10/1991 | Namitz et al. .............. 714/703 |
| 6,092,146 A | * | 7/2000 | Dell et al. ..................... 711/5 |
| 6,519,718 B1 | * | 2/2003 | Graham et al. ............... 714/41 |
| 6,683,372 B1 | * | 1/2004 | Wong et al. ................ 257/686 |

OTHER PUBLICATIONS

Mei-Chen Hsueh et al., "Fault Injection Techniques and Tools," 1997 IEEE, Apr. 1997, pp. 75-82.

* cited by examiner

*Primary Examiner*—Dieu-Minh Le

(57) ABSTRACT

A memory module that comprises a plurality of memory circuits, at least one serial presence detect (SPD) memory circuit, and a plurality of data lines that transfer data to and from the plurality of memory circuits. The memory module may further comprise a testing logic that utilizes data stored in the SPD memory circuit to inject a memory error into one or more of the plurality data lines.

27 Claims, 3 Drawing Sheets

US 7,234,081 B2

MEMORY MODULE WITH TESTING LOGIC

BACKGROUND

Computer systems, for example home computers or high-end computers operated as servers, may utilize memory to store data. The memory may comprise one or more memory modules that are connected together via a memory bus. The memory bus may utilize a signaling convention that facilitates the transfer of data between devices connected to the bus. The devices may comprise memory devices, data converters, and remote input/output ports.

To ensure that the memory associated with a computer system is functioning properly, an error detection mechanism within the computer system's chipset may monitor the memory and detect memory errors. When a memory error is detected, an error handling procedure may correct and/or report the memory error.

To validate and test the error detection mechanism, errors may be artificially injected into the chipset or manually forced at memory level. As memory bus speeds have increased, it may be difficult to reliably inject errors for the purpose of testing and validating the error detection mechanism. Furthermore, artificially injecting errors into chipset may adversely affect system validation.

SUMMARY

The problems noted above may be solved in large part by a memory module with testing logic. One exemplary embodiment may be a memory module that comprises a plurality of memory circuits, at least one serial presence detect (SPD) memory circuit, and a plurality of data lines that transfer data to and from the plurality of memory circuits. The memory module may further comprise a testing logic that utilizes data stored in the SPD memory circuit to inject a memory error into one or more of the plurality data lines.

BRIEF DESCRIPTION OF THE DRAWINGS

For a detailed description of the embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function.

In the following discussion and in the claims, the terms "including" and "comprising" are used in an open-ended fashion, and thus should be interpreted to mean "including, but not limited to . . . " Also, the verb "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. The embodiments disclosed should not be interpreted, or otherwise used, as limiting the scope of the disclosure unless otherwise specified. In addition, one skilled in the art will understand that the following description has broad application, and the discussion of any embodiment is meant only to be exemplary of that embodiment, and not intended to intimate that the scope of the disclosure is limited to that embodiment.

Figure 1:
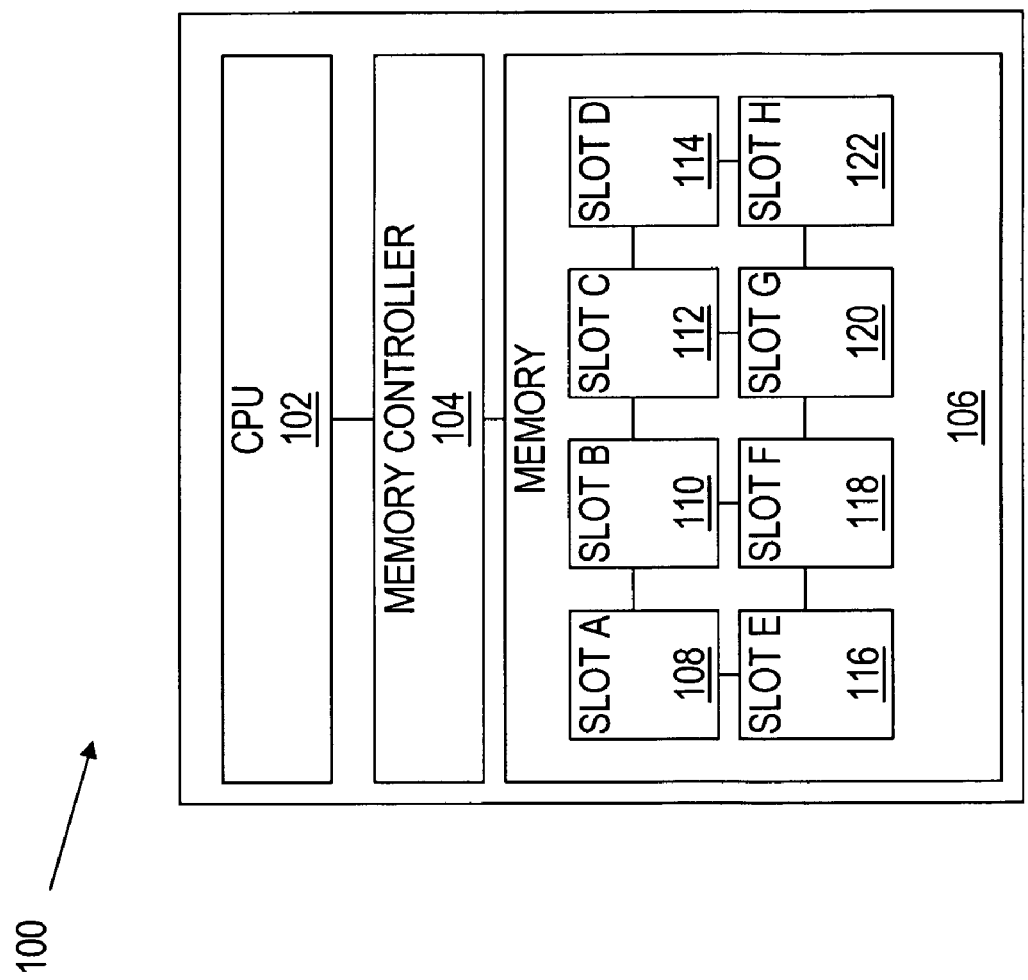
FIG. 1 illustrates a computer system constructed in accordance with embodiments of the invention.

FIG. 1 illustrates an exemplary computer system constructed in accordance with embodiments of the invention. System 100 may be any type of computer system, such as a laptop computer, a personal computer, or stand-alone computer operated as a server. The system 100 may comprise a single central processing unit (CPU) 102, as illustrated in FIG. 1, or may comprise a plurality of CPUs arranged in a configuration where parallel computing may take place. The CPU 102 may couple to a memory controller 104 that manages a memory 106.

The memory 106 may comprise one or more memory slots, each slot designed to interface with a memory module, such as a dual inline memory module (DIMM). Although any number of memory slots may be used, eight memory slots 108-122 are illustrated in the memory 106. Each memory slot 108-122 may interface with a memory module (not specifically shown in FIG. 1) that may comprise any type of memory circuit, such as double data rate (DDR), fast page mode (FPM), and extended data out (EDO). The memory slots 108-122 may be coupled together and to the memory controller 104 via a memory bus (not shown) that facilitates the transfer of data between the memory slots 108-122 and the memory controller 104. The CPU 102, the memory controller 104, and the memory 106 may be associated with a chipset that provides a control and communication mechanism for the system 100. The chipset may comprise the memory slots 108-122 and any other hardware, such as registers, sockets, buffer, and serializers, required to operate the system 100.

Figure 2:
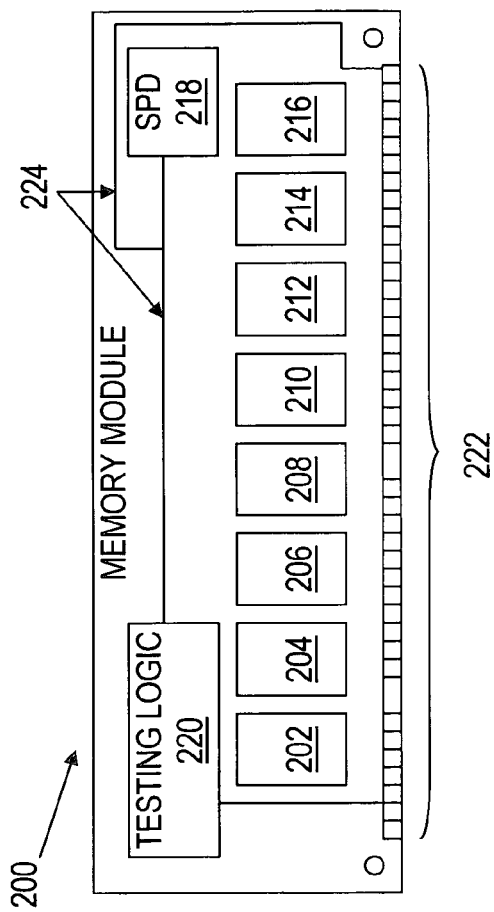
FIG. 2 illustrates a memory module constructed in accordance with embodiments of the invention.

Referring now to FIG. 2, an exemplary memory module is shown in accordance with embodiments of the invention. The memory module 200 may comprise one or more memory circuits that are capable of storing data. Although any number of memory circuits may be used, eight memory circuits 202-216 are illustrated in the memory module 200. In addition, the memory module 200 may comprise a serial presence detect (SPD) 218 memory. The SPD 218 memory may be any type of non-volatile memory, such as electrically erasable programmable read-only memory (EEPROM), that stores data identifying the type of memory module and various memory organization and timing parameters associated with the memory module 200. For example, the SPD 218 memory may store data describing the column access strobe (CAS) latency and the rank (i.e., single or dual rank) of the memory module 200.

Data may be transferred to and from the memory circuits 202-216 via a plurality of data lines (not specifically shown). Each data line may couple to one or more input/output (I/O) pins 222 that interface the memory module 200 with a memory slot 108-122 (FIG. 1). For example, a DIMM may possess 168 total I/O pins, 64 of which are coupled to distinct data lines. The pins not coupled to a data line may be used for various signals, such as address signals, power signals, ground signals, clock signals, and write strobe signals.

In accordance with embodiments of the invention, testing logic in the memory module 200 may inject memory errors into the chipset associated with the memory module by applying a bias voltage on one or more of the data lines. The testing logic 220 may couple to one or more of the data lines and be capable of injecting a memory error into the chipset. The testing logic 220 may be a programming logic array (PLA), a programmable logic device (PLD), or any other logical component capable of applying a bias voltage on a data line in the memory module 200. In addition, the testing logic 220 may couple to the SPD 218 memory and one or more I/O pins 222. The SPD 218 memory and one or more I/O pins 222 may act as inputs for the testing logic 220 and may provide data, such as CAS latency and rank, that indicates when data lines should be electrically biased by the testing logic 220.

Figure 3:
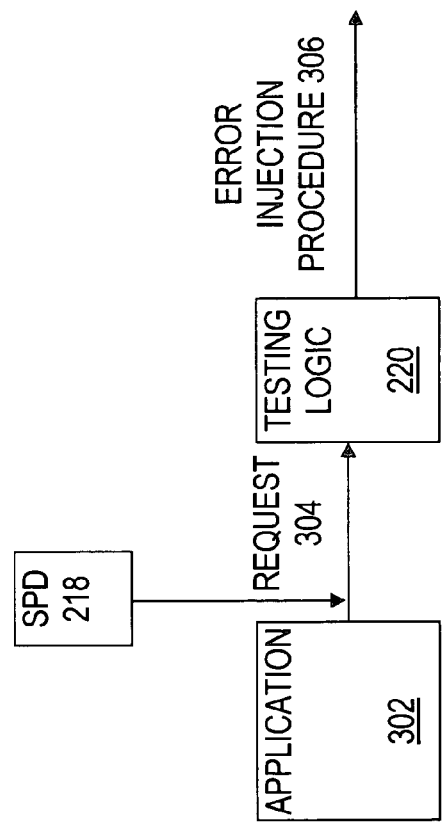
FIG. 3 illustrates a flow diagram of an error injection procedure in accordance with embodiments of the invention.

Referring now to FIG. 3, an exemplary error injection procedure is shown in accordance with embodiments of the invention. An application 302, possibly operated by a user, may provide an interface to the testing logic 220. The application 302 may utilize a basic input/output system (BIOS) call, a high-level driver, or any other means of accessing the testing logic 220 through a memory bus.

The application 302, possibly at the behest of a user, may send a request 304 to the testing logic 220 via a bus 224. The request 304 may represent one or more memory errors to be injected into the chipset. The injected errors may be continuous, lasting indefinitely, or "single-shot," lasting for a single read or write cycle. Further, the errors may be correctable by the error correction code (ECC) implemented by the chipset or uncorrectable. In addition, the error may be injected into a specific location, such as a specific data line or specific memory region. The testing logic 220 may receive the request 304 and utilize the data stored in the SPD 218 memory and testing logic registers to formulate and inject an appropriate error injection procedure 306 onto one or more data lines of the memory module 200.

Figure 4:
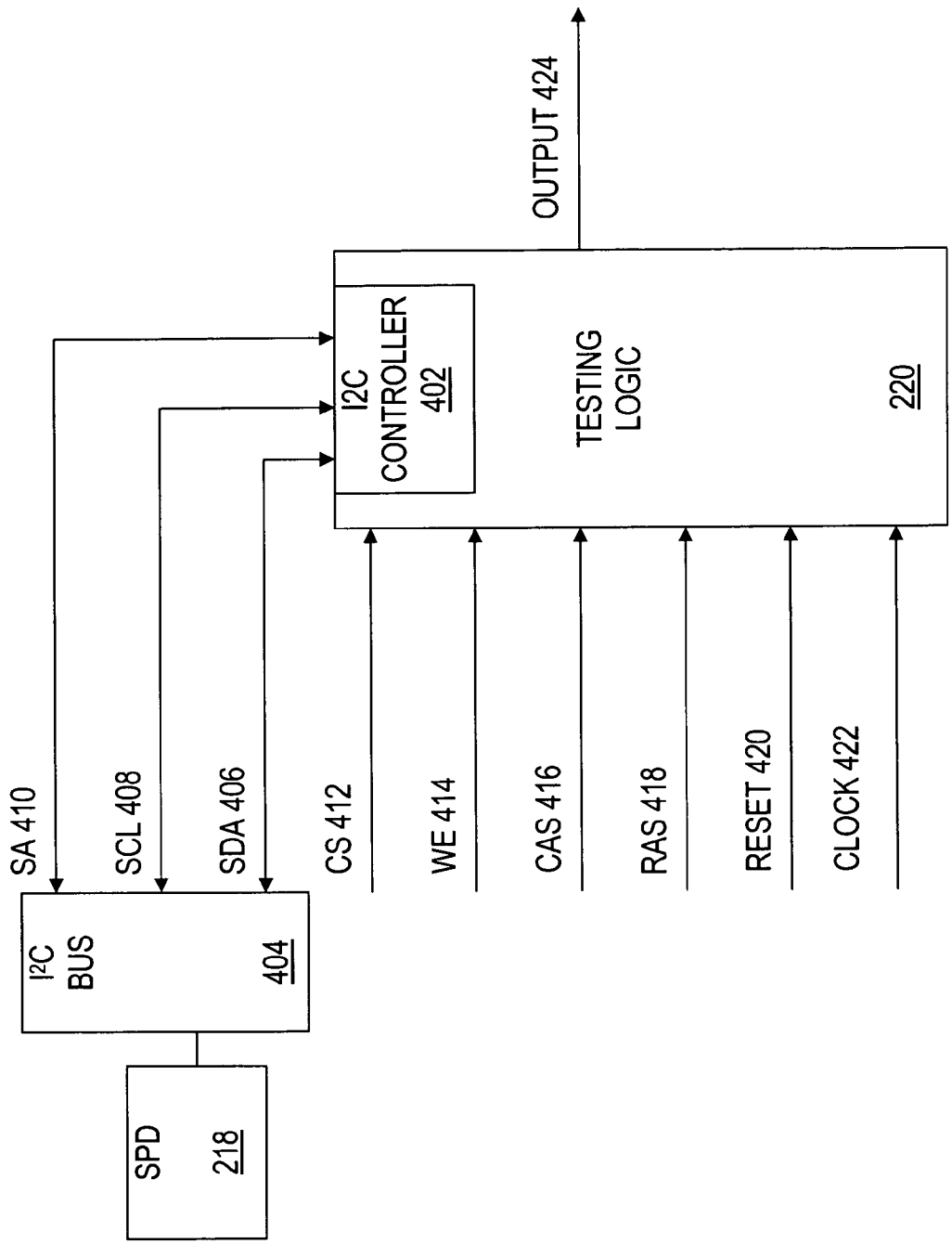
FIG. 4 illustrates the testing logic of FIG. 2 in accordance with embodiments of the invention.

Referring now to FIG. 4, an exemplary configuration of the testing logic 220 is shown in accordance with embodiments of the invention. The testing logic 220 may comprise one or more bus controllers that facilitate the transfer of data from the application 302 (FIG. 3) and the SPD 218 memory to the testing logic 220. For example, the SPD 218 memory may be coupled to and operating on an inter-integrated circuit (I²C) bus 404. The testing logic 220 may comprise an I²C controller 402 that facilitates the transfer of data to and from the I²C bus 404. The application 302 may communicate with the I²C bus 404 through the memory controller 104 (FIG. 1) that may support the I²C bus 404. A serial data line (SDA) 406, a serial clock line (SCL) 408, and one or more serial address (SA) lines 410 may transfer data bi-directionally between the I²C controller 402 and the I²C bus 404. Thus, the testing logic 220 may receive input from the SPD 218 memory and the application 302 (FIG. 3) via the I²C bus 404.

The testing logic 220 may also receive input via a chip select (CS) 412 line, a column address strobe (CAS) 416 line, and a row address strobe (RAS) 418 line. Other inputs to the testing logic 220, such as a write enable 414 line, a reset 402 line, and a clock 422 line, may be included as desired. The CS 412 line, the CAS 416 line, and the RAS 416 line may uniquely identify a unit of memory associated with the memory module 200. This unit of memory may represent a location in the memory module 200 at which to inject a memory error. The testing logic 220 may generate signals on one or more output 424 lines that may couple to one or more data lines of the memory module 200 to inject the memory error. Other logical components, such as Quick-Switches®, may be utilized as desired to assist in implementing the error injection procedure. In addition, other storage components, such as registers, buffers, and queues, may be included in the testing logic 220 as desired.

Since the testing logic 220 comprises the I²C controller 402, the application 302 may address the testing logic 220 as a slave device on the I²C bus 404. Each slave device on an I²C bus is assigned a unique address that may be used to communicate with the device. Thus, the application 302 (FIG. 3) may communicate with the testing logic 220 by sending the request 304 on the I²C bus 404, utilizing the slave address of the testing logic 220.

The testing logic 220 may perform various additional operations relating to memory test and validation. For example, the testing logic 220 may maintain one or more counters and inject a predetermined number of errors into the chipset. In addition, the testing logic 220 may be capable of testing an entire memory region or memory range for a particular memory error.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system comprising:
   a memory module comprising:
      a plurality of memory circuits, wherein at least one of the memory circuits comprises a serial presence detect (SPD) memory circuit;
      a plurality of data lines that transfer the data to and from the plurality of memory circuits; and
      testing logic coupled to at least one of the plurality of data lines, wherein the testing logic utilizes data stored in the SPD memory circuit to inject a memory error into one or more of the plurality of data lines, the injecting externally of the memory circuits.

2. The memory module of claim 1 wherein the testing logic, the memory module, and the SPD memory circuit are coupled to a communications bus.

3. The memory module of claim 1 wherein the testing logic applies a bias voltage on at least one of the plurality of data lines based on a request from a software application.

4. The memory module of claim 1 wherein the testing logic further comprises a bus controller that transfers data from the SPD memory circuit.

5. The memory module of claim 3 wherein the testing logic initializes and maintains a counter of the number of data lines to electrically bias.

6. The memory module of claim 1 wherein the testing logic utilizes a column access strobe (CAS) latency stored in the SPD memory circuit to inject a memory error into one or more of the plurality of data lines.

7. The memory module of claim 1 wherein the testing logic utilizes a memory rank stored in the SPD memory circuit to inject a memory error into one or more of the plurality of data lines.

8. A method comprising:
   sending a request to inject a memory error into a data line external or a memory module, the sending by an application program executed by a computer system;

receiving the request to inject the error into the data line of a memory module, the receiving by a testing logic integrated with the memory module in the computer system; and injecting the error into the data line by a testing logic integrated with the memory module.

9. The method of claim 8 further comprising sending instructions to inject the error to the testing logic from a program executing external to the memory module.

10. The method of claim 9 further comprising sending the instructions on a communication bus.

11. The method of claim 10 further comprising sending the instructions on a serial communications bus.

12. The method of claim 11 wherein the serial communications bus comprises an inter-integrated circuits (I²C) communications bus.

13. The method of claim 8 further comprises injecting the error into a plurality of data lines.

14. The method of claim 8 further comprising injecting a continuous error into the data line.

15. The method of claim 8 further comprising injecting an error lasting only one memory cycle.

16. A computer readable media storing instructions executable by a processor in a computer system to implement a method comprising:

receiving data from a serial presence detect (SPD) device associated with a memory device, the memory device within the computer system;

generating an error injection procedure by the processor based in part on the received data; and applying a bias voltage on at least one data line coupled to the memory device based on the error injection procedure.

17. The computer readable media of claim 16 wherein the error injection procedure is generated in response to a request from a software application executed within the computer system.

18. The computer readable media of claim 16 wherein the data from the SPD memory device comprises a column access strobe (CAS) latency.

19. The computer readable media of claim 16 wherein the data from the SPD memory device comprises a rank of a memory device.

20. The computer readable media of claim 16 wherein data from the SPD memory device is transported through an inter-integrated circuits (I²C) communications bus.

21. A system comprising:

a memory module comprising:

a plurality of means for storing data, wherein at least one of the means for storing comprises a serial presence detect (SPD) memory circuit;

a plurality of means for transferring data to and from the plurality of means for storing data; and a means for applying a bias voltage coupled to the plurality of means for storing data, wherein the means for applying a bias voltage utilizes data stored in the SPD memory circuit to inject an error into at least one of the plurality of means for transferring data, the applying voltage external to the plurality of means for storing.

22. The system of claim 21 wherein the plurality of means for storing data, the SPD memory circuit, and the means for applying a bias voltage are coupled to a communications bus.

23. The system of claim 21 wherein the means for applying a bias voltage electrically biases at least one of the plurality of means for transferring data based on a request from a software application.

24. The system of claim 21 wherein the means for applying a bias voltage further comprises a means for interfacing with a communications bus that is coupled to the SPD memory circuit.

25. The system of claim 21 wherein the means for applying a bias voltage initializes and maintains a counter of the number of the means for transferring data that are to be electrically biased.

26. The system of claim 21 wherein the means for applying a bias voltage biases voltage utilizes a column access strobe (CAS) latency stored in the SPD memory circuit.

27. The system of claim 22 wherein the means for applying a bias voltage utilizes a memory rank stored in the SPD memory circuit.

* * * * *

UNITED STATES PATENT AND TRADEMARK OFFICE
CERTIFICATE OF CORRECTION

| | | |
|---|---|---|
| PATENT NO. | : 7,234,081 B2 | Page 1 of 1 |
| APPLICATION NO. | : 10/771998 | |
| DATED | : June 19, 2007 | |
| INVENTOR(S) | : Vincent Nguyen et al. | |

It is certified that error appears in the above-identified patent and that said Letters Patent is hereby corrected as shown below:

In column 4, line 66, in Claim 8, delete "or" and insert -- of --, therefor.

Signed and Sealed this

Third Day of February, 2009

JOHN DOLL
*Acting Director of the United States Patent and Trademark Office*